(12) United States Patent
Kurokawa et al.

(10) Patent No.: US 11,187,597 B2
(45) Date of Patent: Nov. 30, 2021

(54) TEMPERATURE DETECTION DEVICE, ABNORMALITY DETECTION DEVICE, AND ELECTRIC POWER CONVERSION APPARATUS

(71) Applicant: KEIHIN CORPORATION, Tokyo (JP)

(72) Inventors: Kazunari Kurokawa, Oyama (JP); Tao Trong Bui, Shioya-gun (JP); Kyo Kyo, Shioya-gun (JP); Takuma Kodato, Kanuma (JP)

(73) Assignee: KEIHIN CORPORATION, Tokyo (JP)

( * ) Notice: Subject to any disclaimer, the term of this patent is extended or adjusted under 35 U.S.C. 154(b) by 128 days.

(21) Appl. No.: 16/749,304

(22) Filed: Jan. 22, 2020

(65) Prior Publication Data
US 2020/0253093 A1 Aug. 6, 2020

(30) Foreign Application Priority Data
Feb. 1, 2019 (JP) .............................. JP2019-017420

(51) Int. Cl.
| | | |
|---|---|---|
| *G01K 15/00* | (2006.01) | |
| *H05K 7/20* | (2006.01) | |
| *H02M 3/155* | (2006.01) | |
| *G01K 7/01* | (2006.01) | |
| *H02M 1/32* | (2007.01) | |
| *G01K 1/02* | (2021.01) | |

(Continued)

(52) U.S. Cl.
CPC .......... *G01K 15/007* (2013.01); *G01K 1/026* (2013.01); *G01K 7/01* (2013.01); *H02M 1/007* (2021.05);
(Continued)

(58) Field of Classification Search
CPC ........ H02M 1/007; H02M 1/32; H02M 1/327; H02M 3/003; H02M 3/155–1588;
(Continued)

(56) References Cited

U.S. PATENT DOCUMENTS 5,927,854 A     7/1999 Kroll
9,217,677 B2 *  12/2015 Hamanaka ............... G01K 7/01
(Continued)

FOREIGN PATENT DOCUMENTS

| JP | S63145915 A | 6/1988 |
| JP | S63310099 A | 12/1988 |

(Continued)

OTHER PUBLICATIONS

JPO Notice of Reasons for Rejection for corresponding JP Application No. 2019-017420 dated Oct. 1, 2019.

*Primary Examiner* — Fred E Finch, III
(74) *Attorney, Agent, or Firm* — Cantor Colburn LLP (57) ABSTRACT

A temperature detection device includes: first and second temperature sensors that output temperature signals that are signals corresponding to measured temperatures; a signal conversion circuit that respectively converts the temperature signals, which are output from the first and second temperature sensors, into pulse signals having duty ratios or frequencies corresponding thereto; a multiplexer that selectively outputs one of a plurality of the pulse signals converted by the signal conversion circuit; and an offset unit that offsets the temperature signal, which is output from the first temperature sensor of the first and second temperature sensors, to the signal conversion circuit.

10 Claims, 3 Drawing Sheets

(51) Int. Cl.
*H02M 7/537* (2006.01)
*H02M 1/00* (2006.01)

(52) U.S. Cl.
CPC ............ *H02M 1/327* (2021.05); *H02M 3/155* (2013.01); *H02M 7/537* (2013.01); *H05K 7/20927* (2013.01)

(58) Field of Classification Search
CPC .... H02M 7/003; H02M 7/537; H02M 7/5395; H05K 7/2089; H05K 7/209; H05K 7/20927; H05K 7/20945; G01K 1/026; G01K 7/01; G01K 15/007
See application file for complete search history.

(56) References Cited

U.S. PATENT DOCUMENTS

| | | | | |
|---|---|---|---|---|
| 2008/0238529 | A1* | 10/2008 | Kumagai | G01K 7/01 327/512 |
| 2011/0122917 | A1* | 5/2011 | Hamanaka | G01K 7/01 374/170 |
| 2015/0023076 | A1* | 1/2015 | Nakamori | H02M 1/32 363/56.03 |
| 2015/0204730 | A1* | 7/2015 | Daitoku | H02M 1/32 374/178 |
| 2018/0123441 | A1* | 5/2018 | Yanai | G05B 15/02 |
| 2018/0367032 | A1* | 12/2018 | Hayashi | H02P 29/68 |
| 2018/0367063 | A1* | 12/2018 | Suzuki | H02M 7/53871 |
| 2019/0238124 | A1* | 8/2019 | Tajima | G01R 19/32 |
| 2020/0194994 | A1* | 6/2020 | Goto | H02H 7/205 |
| 2020/0382003 | A1* | 12/2020 | Sakamoto | H02H 5/042 |

FOREIGN PATENT DOCUMENTS

| | | |
|---|---|---|
| JP | 2004117260 A | 4/2004 |
| JP | 2008032507 A | 2/2008 |
| JP | 2011109592 A | 6/2011 |

* cited by examiner

TEMPERATURE DETECTION DEVICE, ABNORMALITY DETECTION DEVICE, AND ELECTRIC POWER CONVERSION APPARATUS

BACKGROUND OF THE INVENTION

Field of the Invention

The present invention claims priority under 35 U.S.C. § 119 to Japanese Patent Application No. 2019-017420, filed on Feb. 1, 2019, the entire content of which is incorporated herein by reference.

Description of Related Art

Japanese Unexamined Patent Application, First Publication No. 2011-109592 discloses a temperature detection device that detects temperatures at a plurality of locations in an inverter circuit using a plurality of temperature-sensitive diodes. Specifically, in the temperature detection device, the output selection circuit selects the highest temperature among the temperatures at the plurality of locations detected by the respective temperature-sensitive diodes. The temperature detection device outputs the selected temperature to the control circuit at the subsequent stage. Then, the control circuit determines the temperature abnormality of an inverter circuit on the basis of the highest temperature.

However, in the control circuit of Japanese Unexamined Patent Application, First Publication No. 2011-109592, it is unclear which location of the plurality of locations the temperature is read out at. Therefore, the control circuit is unable to specify the location of temperature abnormality.

SUMMARY OF THE INVENTION

The inventors have considered that one of the temperatures at a plurality of locations is randomly selected by a multiplexer, and the selected temperature is output to the control circuit. However, depending on the running state of the vehicle, switching of switching elements included in the inverter circuit, or the like, there may be no difference in output between the temperature-sensitive diodes. In such a case, the control circuit is unable to determine whether or not abnormality occurs in the temperature detection device. The control circuit is unable to accurately detect abnormality of the temperature detection device. For example, the abnormality of the temperature detection device is, for example, a failure of the multiplexer.

The present disclosure has been made in view of such circumstances, and an object of the present disclosure is to accurately detect abnormality of a temperature detection device including a multiplexer.

(1) According to an aspect of the present invention, a temperature detection device includes: first and second temperature sensors that output temperature signals that are signals corresponding to measured temperatures; a signal conversion circuit that converts the temperature signals, which are output from the first and second temperature sensors, into pulse signals having duty ratios or frequencies corresponding thereto, respectively; a multiplexer that selectively outputs one of a plurality of the pulse signals converted by the signal conversion circuit; and an offset unit that offsets the temperature signal, which is output from the first temperature sensor of the first and second temperature sensors, to the signal conversion circuit.

(2) In the temperature detection device according to (1), the first and second temperature sensors may be temperature-sensitive diodes.

(3) The temperature detection device according to (1) or (2) further includes a constant current source that outputs a predetermined constant current to the first and second temperature sensors. The offset unit may be a resistor connected in series between the constant current source and the first temperature sensor electrically connected to the constant current source.

(4) According to an aspect of the present invention, an abnormality detection device includes: the temperature detection device according to any one of (1) to (3); and an abnormality determination unit that determines whether or not there is an abnormality in the temperature detection device on the basis of the output of the multiplexer. The signal conversion circuit may generate a first pulse signal having the duty ratio corresponding to the temperature signal of the first temperature sensor which is offset by the offset unit, and generate a second pulse signal having the duty ratio corresponding to the temperature signal of the second temperature sensor. The multiplexer may output the first pulse signal and the second pulse signal alternately for each certain period. In addition, in a case where a difference between the duty ratio of the first pulse signal and the duty ratio of the second pulse signal which are output from the multiplexer is within a predetermined range during a certain time, the abnormality determination unit may determine that the abnormality occurs.

(5) According to an aspect of the present invention, an electric power conversion apparatus includes: a switching element that is cooled down by cooling water and is used in electric power conversion; a cooling device that causes the cooling water to flow inside and cools the switching element; and the temperature detection device according to any one of (1) to (3). The temperature detection device may measure a temperature of the switching element. The switching element may include a first switching element and a second switching element. The first switching element may be disposed upstream of the second switching element in a direction in which the cooling water flows. The first temperature sensor may measure a temperature of the first switching element. The second temperature sensor may measure a temperature of the second switching element.

According to an aspect of the present invention, an electric power conversion apparatus includes: a first switching element and a second switching element that are used in electric power conversion; and the temperature detection device according to (3). The temperature detection device may measure temperatures of the first switching element and the second switching element. The first temperature sensor may be a temperature-sensitive diode that measures the temperature of the first switching element. The second temperature sensor may be a temperature-sensitive diode that measures the temperature of the second switching element. The resistance value of the offset unit may be set on the basis of at least one of a variation in characteristics of the temperature-sensitive diodes and a thermal deviation between the first switching element and the second switching element.

DETAILED DESCRIPTION OF THE INVENTION

Hereinafter, a temperature detection device, an abnormality detection device, and an electric power conversion apparatus according to the present embodiment will be described with reference to the drawings.

Figure 1:
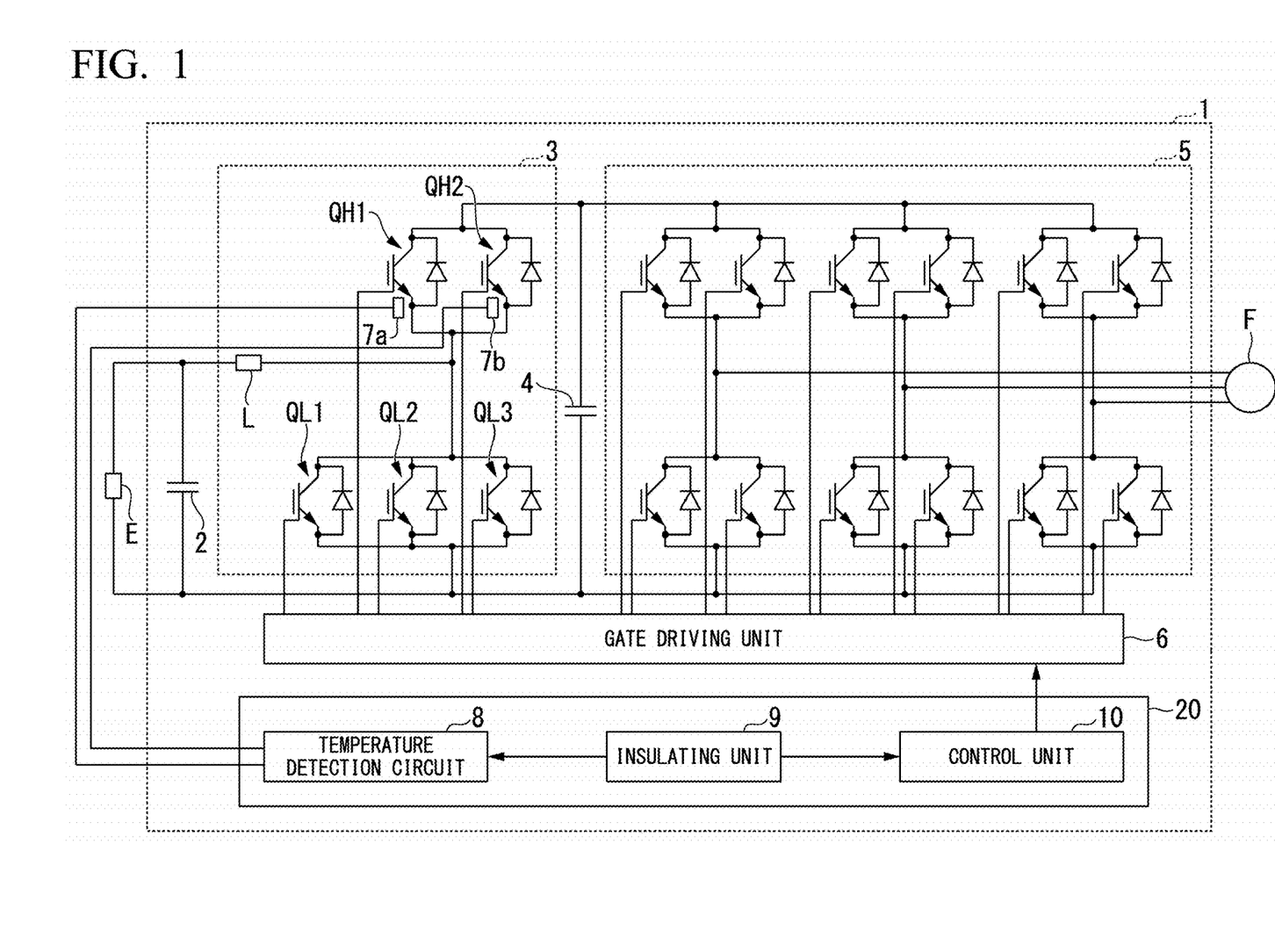
FIG. 1 is a diagram showing an example of a schematic configuration of an electric power conversion apparatus 1 according to the present embodiment.

FIG. 1 is a diagram showing an example of a schematic configuration of an electric power conversion apparatus 1 according to the present embodiment. For example, the electric power conversion apparatus 1 is a power control unit (PCU). The electric power conversion apparatus 1 is mounted on a vehicle that travels using a load F as a power source. For example, the load F is a motor of a hybrid vehicle or an electric vehicle.

As shown in FIG. 1, the electric power conversion apparatus 1 includes a capacitor 2, a boost converter 3, a capacitor 4, an inverter 5, a gate driving unit 6, a plurality of temperature sensors 7, and a control device 20. The control device 20 includes a temperature detection circuit 8, an insulating unit 9, and a control unit 10. The electric power conversion apparatus 1 includes an abnormality detection device 12. The abnormality detection device 12 includes a temperature detection device 11, the insulating unit 9, and a control unit 10. The temperature detection device 11 includes the plurality of temperature sensors 7 and a temperature detection circuit 8. The plurality of temperature sensors 7 and the temperature detection circuit 8 constitute the temperature detection device 11 of the present embodiment. The temperature detection device 11, the insulating unit 9, and the control unit 10 constitute the abnormality detection device 12 of the present embodiment.

The capacitor 2 is a smoothing capacitor provided on the primary side (DC electric power source E side) of the boost converter 3.

The boost converter 3 boosts an input voltage which is input from the DC electric power source E (for example, a battery) at a predetermined boost ratio. The boost converter 3 outputs the boosted voltage to the inverter 5. The boost converter 3 of the present embodiment may step down a regenerative voltage which is input from the inverter 5 at a predetermined step-down ratio. The boost converter 3 may further have a function of outputting a stepped down voltage to the DC electric power source E. Hereinafter, an example of a schematic configuration of the boost converter 3 will be described.

The boost converter 3 includes a reactor L, an upper switching element group QH, and a lower switching element group QL. The upper switching element group QH and the lower switching element group QL are connected in series with each other.

The reactor L has a first end connected to the first end of capacitor 2 and a second end connected to the upper switching element group QH and the lower switching element group QL.

The upper switching element group QH includes a switching element QH1 (first switching element) and a switching element QH2 (second switching element) connected in parallel to each other.

In the present embodiment, the switching element QH1 and the switching element QH2 are insulated gate bipolar transistors (IGBT). However, the switching element QH1 and the switching element QH2 may be, for example, field effective transistors (FET).

Each collector terminal of the switching element QH1 and the switching element QH2 is connected to a first terminal of the capacitor 4. Each emitter terminal of switching element QH1 and switching element QH2 is connected to the second end of the reactor L. Each gate terminal of the switching element QH1 and the switching element QH2 is connected to the gate driving unit 6.

The lower switching element group QL includes a switching element QL1, a switching element QL2, and a switching element QL3 connected in parallel to each other. In the present embodiment, each of the switching element QL1, the switching element QL2, and the switching element QL3 may be an IGBT or a FET.

Each collector terminal of switching element QL1, switching element QL2, and switching element QL3 is connected to the second end of the reactor L. Each emitter terminal of the switching element QL1, the switching element QL2, and the switching element QL3 is connected to the negative terminal of the DC electric power source E and the second terminal of the capacitor 4. Each gate terminal of the switching element QL1, the switching element QL2, and the switching element QL3 is connected to the gate driving unit 6.

The capacitor 4 has a first terminal connected to the collector terminals of the switching element QH1 and the switching element QH2 and a second terminal connected to the negative terminal of the DC electric power source E. For example, the capacitor 4 is a smoothing capacitor.

Figure 3:
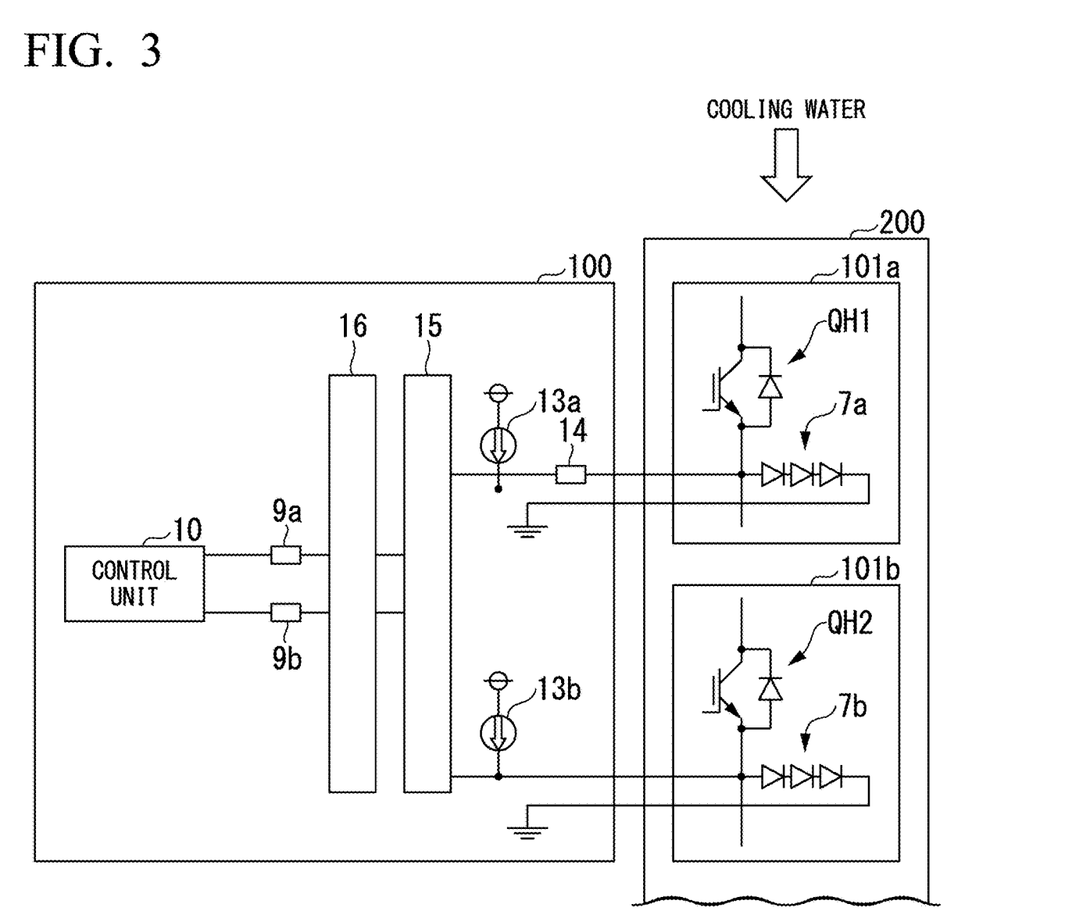
FIG. 3 is a diagram for explaining arrangement positions of switching modules according to the present embodiment.

The electric power conversion apparatus 1 may include a cooling device 200 shown in FIG. 3. The cooling device 200 includes a water jacket. For example, the cooling device 200 may include only a water jacket. The cooling device 200 may include a water jacket and a device that causes cooling water to flow inside the water jacket. The device that causes cooling water to flow inside the water jacket is, for example, a pump. The cooling device 200 may cool the upper switching element group QH and the lower switching element group QL by circulating cooling water inside the water jacket. For example, the upper switching element group QH and the lower switching element group QL are arranged on the water jacket. In the upper switching element group QH, the switching element QH1 is provided upstream of the switching element QH2 in the direction in which the cooling water flows. For example, the switching element QH1 is provided upstream of the switching element QH2 in the direction in which the cooling water flows and is provided on the water jacket. The cooling water flowing inside the cooling device 200 circulates in the order of the switching element QH1 and the switching element QH2 in the upper switching element group QH. The switching element cooled by the cooling device 200 may be a switching element of the inverter 5.

The inverter 5 is controlled by the control unit 10. The inverter 5 is an electric power conversion circuit that converts the input electric power, which is input from the boost converter 3, into AC electric power and supplies the electric power to the load F. The inverter 5 of the present embodiment is a three-phase inverter as shown in the drawings. For example, the inverter 5 includes three switching legs corresponding to the respective phases. A plurality of loads R may be connected to the electric power conversion apparatus 1. In a case where the plurality of loads R are connected to the electric power conversion apparatus 1, the inverter 5 is provided for each load R.

The gate driving unit 6 is controlled by the control unit 10. The gate driving unit 6 drives the boost converter 3 and the inverter 5. For example, the gate driving unit 6 drives the boost converter 3 by outputting driving signals to the gate terminals of the switching elements QH1 and QH2 and the switching elements QL1 to QL3. The gate driving unit 6 drives the inverter 5 by outputting a driving signal to each gate terminal of the switching element included in the inverter 5.

The plurality of temperature sensors 7 measure the temperature in the boost converter 3. The plurality of temperature sensors 7 output signals corresponding to the measured temperatures (hereinafter referred to as "temperature signals") to the temperature detection circuit 8. The temperature sensor 7 of the present embodiment is a temperature-sensitive diode whose forward voltage decreases in accordance with the temperature. However, the temperature sensor 7 is not limited to the temperature-sensitive diode. The temperature sensor 7 may measure the temperature in the boost converter 3 and output a signal corresponding to the measured temperature. The temperature signal is a signal indicating a voltage value corresponding to the temperature measured by the temperature sensor 7. In a case where the temperature sensor 7 is a temperature-sensitive diode, the temperature signal is a signal indicating the forward voltage of the temperature-sensitive diode.

The plurality of temperature sensors 7 of the present embodiment are a temperature sensor 7a (first temperature sensor) and a temperature sensor 7b (second temperature sensor).

The temperature sensors 7a and 7b measure the temperatures T of the switching elements of boost converter 3. The temperature sensor 7a of the present embodiment detects the temperature of the switching element QH1 of the upper switching element group QH. For example, the temperature sensor 7a is provided in the vicinity of the switching element QH1. The temperature sensor 7b detects the temperature of the switching element QH2 of the upper switching element group QH. For example, the temperature sensor 7b is provided in the vicinity of the switching element QH2.

The temperature sensor 7a and the switching element QH1 constitute a first switching module. The temperature sensor 7b and the switching element QH2 constitute a second switching module.

The temperature detection circuit 8 acquires a temperature signal Va which is output from the temperature sensor 7a and a temperature signal Vb which is output from the temperature sensor 7b. Then, the temperature detection circuit 8 selectively output either one of a first pulse signal Pa corresponding to the temperature signal Va and a second pulse signal Pb corresponding to the temperature signal Vb to the control unit 10.

The insulating unit 9 electrically insulates the gap between the temperature detection circuit 8 and the control unit 10. The insulating unit 9 may electrically insulate the gap between the temperature detection circuit 8 and the control unit 10. The insulating unit 9 is, for example, an insulating transformer.

The control unit 10 controls the driving of the boost converter 3 and the inverter 5 by controlling the gate driving unit 6. The control unit 10 detects an abnormality of the temperature detection device 11 on the basis of the outputs (pulse signals) from the temperature detection circuit 8.

Figure 2:
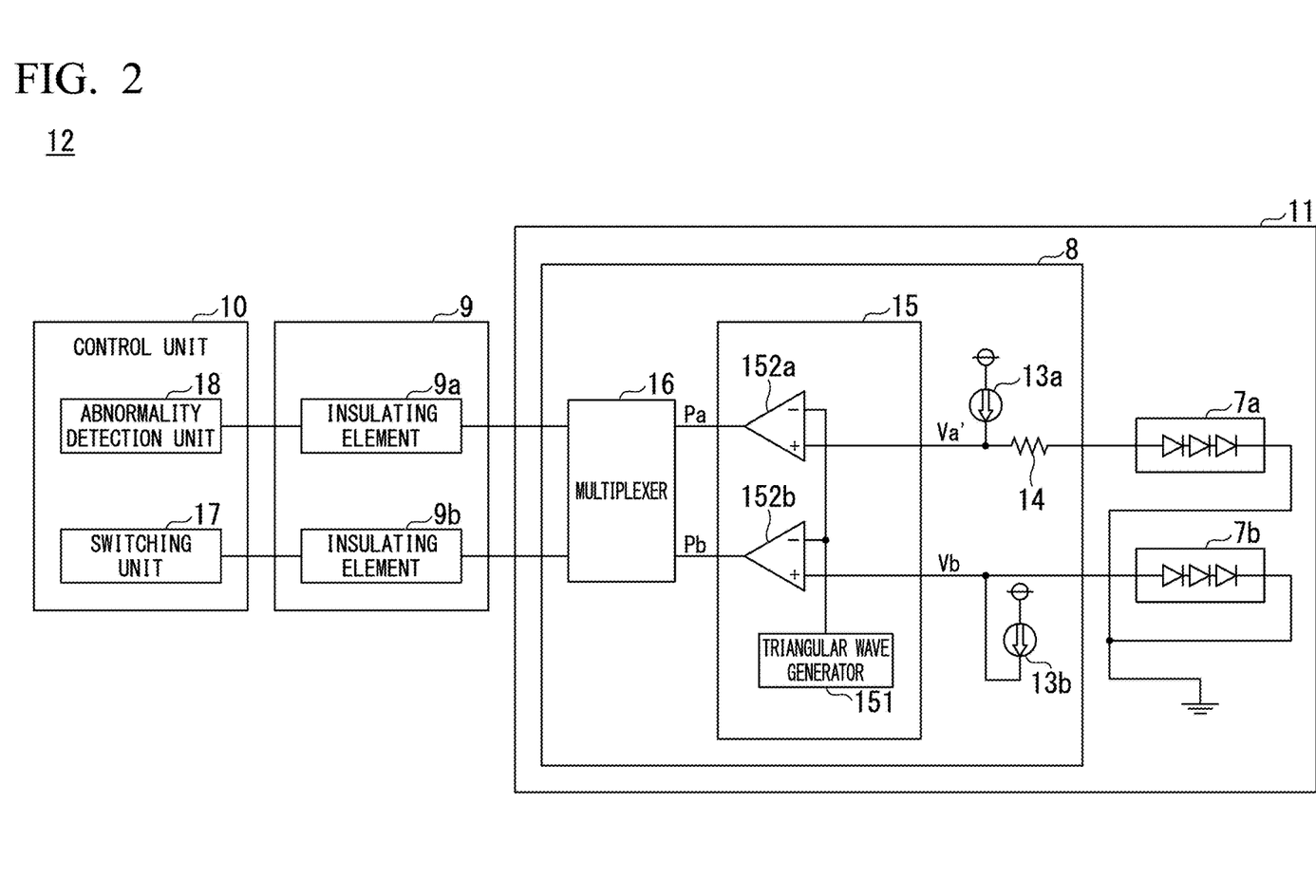
FIG. 2 is a schematic configuration diagram of an abnormality detection device 12 of the electric power conversion apparatus 1 according to the present embodiment.

The configuration of the temperature detection device 11 and the control unit 10 of the present embodiment will be specifically described with reference to FIG. 2. FIG. 2 is a schematic configuration diagram of the abnormality detection device 12 of the present embodiment.

The abnormality detection device 12 according to the present embodiment includes the temperature detection device 11 and the control unit 10. The temperature detection device 11 includes the plurality of temperature sensors 7 and the temperature detection circuit 8.

The temperature detection circuit 8 includes constant current sources 13a and 13b, an offset unit 14, a signal conversion circuit 15, and a multiplexer 16.

The constant current source 13a outputs a predetermined constant current to the temperature sensor 7a. Thereby, the temperature sensor 7a is driven, and the temperature sensor 7a outputs the temperature signal Va to the signal conversion circuit 15.

The constant current source 13a has a first end connected to the electric power source and a second end (output terminal) electrically connected to the anode of the temperature sensor 7a. The electric power source is an electric power source generated from the output of an auxiliary battery (not shown). The auxiliary battery is provided in the vehicle. The auxiliary battery is a battery different from the DC electric power source E.

The constant current source 13b outputs a predetermined constant current to the temperature sensor 7b. Thereby, the temperature sensor 7b is driven, and the temperature sensor 7b outputs the temperature signal Vb to the signal conversion circuit 15.

The constant current source 13b has a first end connected to the electric power source and a second end (output terminal) electrically connected to the anode of the temperature sensor 7b.

The offset unit 14 offsets the temperature signal Va of the temperature sensor 7a by a predetermined value. For example, the offset unit 14 offsets the temperature signal Va of the temperature sensor 7a by a predetermined voltage. Therefore, the temperature signal Va, which is output from the temperature sensor 7a to the signal conversion circuit 15, is offset by a predetermined value. Hereinafter, the temperature signal Va, which is offset by the offset unit 14, is referred to as "temperature signal Va'".

The offset unit 14 of the present embodiment is a resistor. However, the offset unit 14 is not limited to the resistor, and may be other than the resistor as long as the offset unit 14 is able to offset the temperature signal Va by a predetermined value.

The offset unit 14 is connected in series between the output terminal of the constant current source 13a and the anode of the temperature sensor 7a. For example, the offset unit 14 is provided on a current path of a constant current which is output from the constant current source 13a toward the temperature sensor 7a.

The voltage range of the temperature signal Va' (hereinafter referred to as "first voltage range") and the voltage range of the temperature signal Vb (hereinafter referred to as "second voltage range") do not overlap even partially. In a case where the temperature signal Va is offset by the offset unit 14, the voltage range of the temperature signal Va' is set so as not to overlap even part of the voltage range of the temperature signal Vb. The offset amount by which the offset unit 14 offsets the temperature signal Va is set such that the voltage range of the temperature signal Va' and the voltage range of the temperature signal Vb do not overlap. The offset amount is the predetermined value. The resistance value of the resistor that is the offset unit 14 of the present embodiment is set such that the voltage range of the temperature signal Va' and the voltage range of the temperature signal Vb do not overlap even partially. It should be noted that the first voltage range is a voltage range between the upper limit value and the lower limit value of the temperature signal Va'. For example, the upper limit value is a voltage value of the temperature signal Va' in a case where the temperature sensor 7a measures the upper limit temperature that is the upper limit of the temperature range that can be measured by the temperature sensor 7a.

The signal conversion circuit 15 generates the first pulse signal Pa having a duty ratio or frequency corresponding to the temperature signal Va'. The signal conversion circuit 15 generates the second pulse signal Pb having a duty ratio or frequency corresponding to the temperature signal Vb.

Specifically, the signal conversion circuit 15 includes a triangular wave generator 151 and comparators 152a and 152b.

The triangular wave generator 151 generates a triangular wave. The triangular wave generator 151 outputs the generated triangular wave to the comparator 152a and the comparator 152b.

The comparator 152a compares the voltage of the temperature signal Va' acquired from the temperature sensor 7a through the offset unit 14 and the voltage of the triangular wave generated by the triangular wave generator 151. The comparator 152a generates the first pulse signal Pa having a duty ratio D1 according to the comparison result. The comparator 152a outputs the generated first pulse signal Pa to the multiplexer 16.

The comparator 152b compares the voltage of the temperature signal Vb acquired from the temperature sensor 7b through the offset unit 14 and the voltage of the triangular wave generated by the triangular wave generator 151. The comparator 152b generates the second pulse signal Pb having a duty ratio D2 corresponding to the comparison result. The comparator 152b outputs the generated second pulse signal Pb to the multiplexer 16.

The multiplexer 16 is connected to the signal conversion circuit 15. The multiplexer 16 selectively outputs one pulse signal of the first pulse signal Pa and the second pulse signal Pb generated by the signal conversion circuit 15. For example, in a case where the multiplexer 16 receives the first switching signal from the control unit 10, the multiplexer 16 selects the first pulse signal Pa from the first pulse signal Pa and the second pulse signal Pb. Then, the multiplexer 16 outputs the selected first pulse signal Pa to the control unit 10. The first switching signal is a signal for switching the output of the multiplexer 16. The first switching signal is a signal for switching the output of the multiplexer 16 so as to output the first pulse signal Pa.

Further, in a case where the multiplexer 16 receives the second switching signal from the control unit 10, the multiplexer 16 selects the second pulse signal Pb of the first pulse signal Pa and the second pulse signal Pb. Then, the multiplexer 16 outputs the selected second pulse signal Pb to the control unit 10. The second switching signal is a signal for switching the output of the multiplexer 16. The second switching signal is a signal for switching the output of the multiplexer 16 so as to output the second pulse signal Pb.

The insulating unit 9 includes an insulating element 9a and an insulating element 9b that electrically insulate the gap between the temperature detection circuit 8 and the control unit 10. As a result, as shown in FIG. 2, the first pulse signal Pa and the second pulse signal Pb are output to the control unit 10 through the insulating element 9a. The first switching signal and the second switching signal are output to the multiplexer 16 through the insulating element 9b.

Next, a schematic configuration of the control unit 10 according to the present embodiment will be described.

The control unit 10 includes a switching unit 17 and an abnormality determination unit 18.

The switching unit 17 outputs one of the first switching signal and the second switching signal to the multiplexer 16. For example, the switching unit 17 may alternately output the first switching signal and the second switching signal to the multiplexer 16 for each certain period. For example, the switching unit 17 may alternately output the first switching signal and the second switching signal to the multiplexer 16 for each first period.

The abnormality determination unit 18 determines whether or not there is an abnormality in the temperature detection circuit 8 on the basis of the first pulse signal Pa and the second pulse signal Pb. The abnormality of the temperature detection circuit 8 is, for example, an abnormality of the multiplexer 16. For example, the abnormality determination unit 18 separately reads the duty ratio D1 of the first pulse signal Pa and the duty ratio D2 of the second pulse signal Pb in the second period. The second period is smaller than the first period. The abnormality determination unit 18 determines that no abnormality occurs in the temperature detection circuit 8 in a case where the difference (D1−D2) between the duty ratio D1 and the duty ratio D2 is constantly outside the predetermined range for a predetermined time. For example, the value outside the predetermined range is equal to or greater than a threshold value Dth. On the other hand, the abnormality determination unit 18 determines that an abnormality occurs in the temperature detection circuit 8 in a case where the difference (D1−D2) between the duty ratio D1 and the duty ratio D2 is once or temporarily within the predetermined range for the predetermined time. The term "within the predetermined range" is, for example, a range less than the threshold value Dth.

However, the method for determining whether or not the temperature detection circuit 8 is abnormal in the abnormality determination unit 18 is not limited to the above-mentioned method. The abnormality determination unit 18 may use a known technique as long as the technique is able to determine whether or not the temperature detection circuit 8 is abnormal on the basis of the first pulse signal Pa and the second pulse signal Pb.

For example, the abnormality determination unit 18 may determine that no abnormality occurs in the temperature detection circuit 8 in a case where the duty ratio D1 is maintained within the first range and the duty ratio D2 is maintained within the second range for a predetermined time after the output of the multiplexer 16 is switched in response to either the first switching signal or the second switching signal. On the other hand, the abnormality determination unit 18 may determine that an abnormality occurs in the temperature detection circuit 8 in a case of detecting that the duty ratio D1 is greater than or equal to the first range or the duty ratio D2 is greater than or equal to the second range for a predetermined time after the output of the multiplexer 16 is switched in response to the first switching signal or the second switching signal. The first range and the second range may be the same range or different ranges.

Next, the operation of the abnormality detection device 12 according to the present embodiment will be described.

The temperature sensor 7a measures the temperature of the switching element QH1 and outputs the temperature signal Va corresponding to the measured temperature to the temperature detection circuit 8. The temperature sensor 7b measures the temperature of the switching element QH2, and outputs the temperature signal Vb corresponding to the measured temperature to the temperature detection circuit 8. The temperature signal Vb is acquired by the signal conversion circuit 15 as it is. However, the offset unit 14 offsets the temperature signal Va by a predetermined value before being acquired by the signal conversion circuit 15. Therefore, the signal conversion circuit 15 acquires the temperature signal Va' which is offset by the predetermined value by the offset unit 14.

The signal conversion circuit 15 converts the temperature signal Va' into the first pulse signal Pa having the duty ratio D1 corresponding to the temperature signal Va'. The signal conversion circuit 15 converts the temperature signal Vb into the second pulse signal Pb having the duty ratio D2 corresponding to the temperature signal Vb. Then, the signal conversion circuit 15 outputs the first pulse signal Pa and the second pulse signal Pb to the multiplexer 16. The multiplexer 16 alternately outputs the first pulse signal Pa and the second pulse signal Pb for each first period. The offset unit 14 causes a difference in voltage between the temperature signal Va' and the temperature signal Vb. For this reason, in a case where the multiplexer 16 is operating normally, a certain difference or more occurs between the duty ratio D1 and the duty ratio D2. Therefore, even when the control unit 10 outputs either the first switching signal or the second switching signal, it may determine that an abnormality occurs in the multiplexer 16 in a case where the duty ratio of the pulse signal which is output from the multiplexer 16 does not change. The case where the duty ratio of the pulse signal does not change includes a case where the voltage difference between the duty ratio D1 and the duty ratio D2 is small enough to be ignored.

The temperature detection device 11 of the present embodiment includes the offset unit 14 that offsets the temperature signal Va which is output to the signal conversion circuit 15 from the temperature sensor 7a of the temperature sensors 7a and 7b.

With such a configuration, in a case where no abnormality occurs, a voltage difference is generated between the temperature signal Va' and the temperature signal Vb. Therefore, the temperature detection device 11 is able to detect the abnormality of the multiplexer 16 on the basis of the voltage difference. For example, the abnormality of the multiplexer 16 is an event in which the output of the multiplexer 16 is not switched.

The temperature sensor 7a may measure the temperature of the switching element QH1. The temperature sensor 7b may measure the temperature of the switching element QH2. The switching element QH1 may be disposed upstream of the switching element QH2 in the direction in which the cooling water flows. For example, as shown in FIG. 3, the temperature detection circuit 8, the insulating unit 9, and the control unit 10 are mounted on the substrate 100. The first switching module 101a is provided upstream of the second switching module 101b in the direction in which the cooling water flows. The first switching module 101a includes the temperature sensor 7a and the switching element QH1. The second switching module 101b includes the temperature sensor 7b and the switching element QH2.

In such a case, the offset unit 14 is electrically connected to the temperature sensor 7a. The temperature sensor 7a is provided upstream in the direction in which the cooling water flows. Thereby, the difference between the temperature measured by the temperature sensor 7a and the temperature measured by the temperature sensor 7b becomes larger. Therefore, the temperature detection device 11 is able to suppress erroneous detection of abnormality of the temperature detection circuit 8.

The switching element for electric power conversion of the present invention is at least one of the switching element of the boost converter 3 and the switching element of the inverter 5.

The resistance value of the offset unit 14 may be set on the basis of at least one of a variation in characteristics of the temperature-sensitive diodes of the temperature sensor 7a and the temperature sensor 7b and a thermal deviation between the switching element QH1 and the switching element QH2. For example, even in a case where the resistance value of the offset unit 14 has the variation and the thermal deviation, an abnormality occurs in the temperature detection circuit 8. In this case, the difference (D1-D2) between the duty ratio D1 and the duty ratio D2 may be set to be within a predetermined range (for example, to be less than the threshold value Dth). Further, for example, even in a case where the resistance value of the offset unit 14 has the variation and the thermal deviation, an abnormality occurs in the temperature detection circuit 8. In this case, the duty ratio D1 may be set to be outside the first range.

Although the temperature sensor 7a and the temperature sensor 7b of the present embodiment measured the temperature of the switching element of the upper switching element group QH, the present invention is not limited to this. The temperature sensor 7a and the temperature sensor 7b may measure temperatures of the switching elements of the lower switching element group QL. For example, the temperature sensor 7a may measure the temperature of the switching element QL2, and the temperature sensor 7b may measure the temperature of the switching element QL3.

Although the embodiments of the present invention have been described in detail with reference to the drawings, the specific configuration is not limited to this embodiment, and includes designs and the like without departing from the scope of this invention.

According to the temperature detection device, the abnormality detection device, and the electric power conversion apparatus, it is possible to accurately detect abnormality of the temperature detection device including the multiplexer.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1: electric power conversion apparatus
7a: temperature sensor (first temperature sensor)
7b: temperature sensor (second temperature sensor)
8: temperature detection circuit
10: control unit
13a, 13b: constant current source
14: offset unit
15: signal conversion circuit
16: multiplexer
17: switching unit
18: abnormality determination unit

What is claimed is:
1. A temperature detection device comprising:
  first and second temperature sensors that output temperature signals that are signals corresponding to measured temperatures;

a signal conversion circuit that converts the temperature signals, which are output from the first and second temperature sensors, into pulse signals having duty ratios or frequencies corresponding thereto, respectively;

a multiplexer that selectively outputs one of a plurality of the pulse signals converted by the signal conversion circuit; and an offset unit that offsets the temperature signal, which is output from the first temperature sensor of the first and second temperature sensors, to the signal conversion circuit.

2. The temperature detection device according to claim 1, wherein the first and second temperature sensors are temperature-sensitive diodes.

3. An abnormality detection device comprising:
the temperature detection device according to claim 2; and an abnormality determination unit that determines whether or not there is an abnormality in the temperature detection device on the basis of the output of the multiplexer, wherein the signal conversion circuit generates a first pulse signal having the duty ratio corresponding to the temperature signal of the first temperature sensor which is offset by the offset unit, and generates a second pulse signal having the duty ratio corresponding to the temperature signal of the second temperature sensor, wherein the multiplexer outputs the first pulse signal and the second pulse signal alternately for each certain period, and wherein in a case where a difference between the duty ratio of the first pulse signal and the duty ratio of the second pulse signal which are output from the multiplexer is within a predetermined range during a certain time, the abnormality determination unit determines that the abnormality occurs.

4. An electric power conversion apparatus comprising:
a switching element that is used in electric power conversion;
a cooling device that causes cooling water to flow inside and cools the switching element; and
the temperature detection device according to claim 2,
wherein the temperature detection device measures a temperature of the switching element,
wherein the switching element includes a first switching element and a second switching element,
wherein the first switching element is disposed upstream of the second switching element in a direction in which the cooling water flows,
wherein the first temperature sensor measures a temperature of the first switching element, and
wherein the second temperature sensor measures a temperature of the second switching element.

5. The temperature detection device according to claim 1, further comprising
a constant current source that outputs a predetermined constant current to the first and second temperature sensors,
wherein the offset unit is a resistor connected in series between the constant current source and the first temperature sensor electrically connected to the constant current source.

6. An abnormality detection device comprising:
the temperature detection device according to claim 5; and an abnormality determination unit that determines whether or not there is an abnormality in the temperature detection device on the basis of the output of the multiplexer, wherein the signal conversion circuit generates a first pulse signal having the duty ratio corresponding to the temperature signal of the first temperature sensor which is offset by the offset unit, and generates a second pulse signal having the duty ratio corresponding to the temperature signal of the second temperature sensor, wherein the multiplexer outputs the first pulse signal and the second pulse signal alternately for each certain period, and wherein in a case where a difference between the duty ratio of the first pulse signal and the duty ratio of the second pulse signal which are output from the multiplexer is within a predetermined range during a certain time, the abnormality determination unit determines that the abnormality occurs.

7. An electric power conversion apparatus comprising:
a switching element that is used in electric power conversion;
a cooling device that causes cooling water to flow inside and cools the switching element; and
the temperature detection device according to claim 5,
wherein the temperature detection device measures a temperature of the switching element,
wherein the switching element includes a first switching element and a second switching element,
wherein the first switching element is disposed upstream of the second switching element in a direction in which the cooling water flows,
wherein the first temperature sensor measures a temperature of the first switching element, and
wherein the second temperature sensor measures a temperature of the second switching element.

8. An electric power conversion apparatus comprising:
a first switching element and a second switching element that are used in electric power conversion; and
the temperature detection device according to claim 5,
wherein the temperature detection device measures temperatures of the first switching element and the second switching element,
wherein the first temperature sensor is a temperature-sensitive diode that measures the temperature of the first switching element,
wherein the second temperature sensor is a temperature-sensitive diode that measures the temperature of the second switching element, and
wherein a resistance value of the offset unit is set on the basis of a variation in characteristics of the temperature-sensitive diodes and/or a thermal deviation between the first switching element and the second switching element.

9. An abnormality detection device comprising:
the temperature detection device according to claim 1; and
an abnormality determination unit that determines whether or not there is an abnormality in the temperature detection device on the basis of the output of the multiplexer, wherein the signal conversion circuit generates a first pulse signal having the duty ratio corresponding to the temperature signal of the first temperature sensor which is offset by the offset unit, and generates a second pulse signal having the duty ratio corresponding to the temperature signal of the second temperature sensor, wherein the multiplexer outputs the first pulse signal and the second pulse signal alternately for each certain period, and wherein in a case where a difference between the duty ratio of the first pulse signal and the duty ratio of the second pulse signal which are output from the multiplexer is within a predetermined range during a certain time, the abnormality determination unit determines that the abnormality occurs.

10. An electric power conversion apparatus comprising:
a switching element that is used in electric power conversion;
a cooling device that causes cooling water to flow inside and cools the switching element; and
the temperature detection device according to claim 1,
wherein the temperature detection device measures a temperature of the switching element,
wherein the switching element includes a first switching element and a second switching element,
wherein the first switching element is disposed upstream of the second switching element in a direction in which the cooling water flows,
wherein the first temperature sensor measures a temperature of the first switching element, and
wherein the second temperature sensor measures a temperature of the second switching element.

* * * * *